(12) United States Patent
Schriks et al.

(10) Patent No.: US 7,858,444 B2
(45) Date of Patent: Dec. 28, 2010

(54) ELECTRONIC DEVICE AND METHOD OF MANUFACTURING THEREOF

(75) Inventors: Cornelis Gerardus Schriks, Nijmegen (NL); Paul Dijkstra, Nijmegen (NL); Peter Wilhelmus Maria Van De Water, Nijmegen (NL); Roelf Anco Jacob Groenhuis, Nijmegen (NL); Johannus Wilhelmus Weekamp, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 12/391,064

(22) Filed: Feb. 23, 2009

(65) Prior Publication Data

US 2009/0162791 A1 Jun. 25, 2009

Related U.S. Application Data

(62) Division of application No. 10/575,581, filed as application No. PCT/IB2004/052068 on Oct. 12, 2004, now Pat. No. 7,514,801.

(30) Foreign Application Priority Data

Oct. 15, 2003 (EP) .................. 03103818

(51) Int. Cl.
*H01L 23/02* (2006.01)
*H01L 23/28* (2006.01)

(52) U.S. Cl. ............... 438/112; 438/124; 438/106; 438/127; 257/678; 257/787; 257/786; 257/738; 257/737; 257/684

(58) Field of Classification Search ............ 438/112, 438/124, 106, 127; 257/678, 787, 781, 786, 257/738, 737, 684
See application file for complete search history.

(56) References Cited

FOREIGN PATENT DOCUMENTS

WO    WO03/085731    *   4/2003

* cited by examiner

*Primary Examiner*—Kenneth A. Parker
*Assistant Examiner*—Joseph Nguyen

(57) ABSTRACT

The device has a carrier and an electric element. The carrier has a first and an opposed side and is provided with an connection layer, an intermediate layer and contact pads. The element is present at the first side and coupled to the connection layer. It is at least partially encapsulated by an encapsulation that extends into isolation areas between patterns in the intermediate layer. A protective layer is present at the second side of the carrier, which covers an interface between the contact pads and the intermediate layer.

10 Claims, 1 Drawing Sheet

ELECTRONIC DEVICE AND METHOD OF MANUFACTURING THEREOF

The invention relates to a method of manufacturing an electronic device provided with an electric element and a carrier with a first side and an opposed second side, comprising the steps of:

providing the carrier comprising a patterned connection layer, an intermediate layer and a continuous carrier layer, which connection layer is present at the first side of the carrier, said intermediate layer comprising an electrically conductive material and having a pattern substantially corresponding to that of the connection layer;

mounting the electric element to the carrier;

applying an electrically insulating material which extends to a surface of the intermediate layer; and removing the carrier layer at least partly and creating contact pads for external contacting, which contact pads are connected to the corresponding bond pads through interconnects in the intermediate layer.

The invention also relates to an electronic device provided with an electric element and an encapsulation of electrically insulating material, and a carrier with a first side facing the element and an opposed second side, said carrier comprising:

a patterned connection layer contact pads for coupling to an external carrier or element, and an intermediate layer of electrically conductive material, which is patterned so as to create interconnects between the interconnection layer and the contact pads, interconnects are mutually isolated by isolation areas, the encapsulation extending into the isolation areas.

Such a method and such a device are known from US-A 2001/0049156. The known device has a carrier with an intermediate layer of for instance copper. The bond pads hereon are of a bilayer of nickel and gold. The carrier layer is for instance a polyimide or polyester tape that is attached to the intermediate layer with a layer of silicone adhesive. The intermediate layer is patterned with an etching method, wherein the bond pads act as etch mask. The etching is done such that that the side faces created in the intermediate layer have a concave profile. This enhances the adhesion between the intermediate layer and the electrically insulating material that is subsequently provided to form the encapsulation. After the etching an electric element is mounted on the carrier. This element is in this case a semiconductor device that is subsequently encapsulated in the encapsulation. After the provision of the encapsulation, the carrier layer is completely removed. Then the contact pads are provided in a protective flash treatment. This treatment results thereon that the portions of the intermediate layer that remain after patterning thereof, are provided with a bilayer of nickel and gold.

It is a disadvantage of the device of the invention, that the contact pads are located directly opposite to the bond pads. This is disadvantageous as it is generally needed to do some rerouting in the carrier in order to match the pitch of the bond pads with the pitch of the external board to which the contact pads are to be connected. The different pattern might be provided with the help of a photoresist mask, that is applied after removal of the carrier layer. However, photolithographic steps are undesired in assembly factory.

It is therefore a first object of the invention to provide a method of the kind mentioned in the opening paragraph, which results in a device that allows rerouting and/or interconnecting in the carrier and with a good adhesion of the carrier to the encapsulation without the risk of delamination during any further soldering steps.

This object is achieved in that as the carrier a carrier with a carrier layer of electrically conductive material is used;

the carrier layer is partly removed, so as to pattern it from the second side of the carrier, therewith creating contact pads for external contacting, which contact pads are connected to corresponding patterns in the connection layer through interconnects in the intermediate layer, and a protective layer is provided at the second side of the carrier which covers an interface between the intermediate layer and the contact pads.

In the method of the invention, a specific carrier is used, which comprises a metal layers opposite to the intermediate layer. One of these layers acts as the carrier layer, and is patterned after the provision of the electrically insulating material. The use of such a carrier is described in the non-prepublished application WO-IB03/01421 (PHNL020327). It has the important advantage that the patterns of the connection layer can be mechanically anchored in the electrically insulating material, in that they extend laterally with respect to the intermediate layer. It is furthermore the advantage that the pattern in the connection layer need not to be the same as that provided in the carrier layer.

However, it has been found that delamination problems may occur between the intermediate layer and the contact pads. Such problems turn out to occur in a further stage of processing when the device is soldered to an external board. This problem is now solved in that with a protective layer, that covers the interface between the intermediate layer and the contact pads.

In a preferred embodiment, the carrier comprises a patterned masking layer at its second side. This masking layer will first function as an etch mask for patterning the carrier layer. Subsequently, it acts as an adhesion layer to solder needed for a connection to an external board. Suitable materials include bilayer of NiPd or NiAu or even NiPdAu. By including the etch mask in the carrier, no additional photomask need to be applied during the assembly process. A carrier with such an etch mask and its use is described in the non-prepublished application WO IB03/01299 (PHNL021100).

The constitution and the method of application of protective layer may vary as desired in accordance with the further requirements of the device and with any technological possibilities of an assembly factory. Techniques such as spraying, dipping, coating and even vapour deposition are all applicable. This is particularly so, since the protective layer is applied before separation of the assembly into a plurality of individual devices. The main requirement is of course that the contact pads should not be damaged such that coupling to an external board becomes impossible.

The protective layer may both be electrically conductive and electrically insulating. In case that the device is meant for use with a lead-free solder, a temperature stability of this type of solder, currently about 260° C., is needed. A suitable electrically conductive layer for use is combination with a carrier comprising Cu for the contact pads and Al or an Al alloy for the intermediate layer is for instance Sn. As this does not adhere to Al very well, the exposed surface of the Al does not become solderable. An alternative might be the use of Ni, but then measures are needed to prevent that a laterally extending surface of the intermediate layer becomes solderable.

In case that the protective layer is an electrically insulating layer. It is then highly preferred to provide the protective layer in a patterned matter. This can be achieved in different ways.

In a first embodiment, use is made of the difference in surface properties between the contact pads, particularly any adhesion layer thereon, and the other materials. This is for instance realized by the choice of suitable material in a suitable solvent.

An alternative realization of this first embodiment is a two-step method. In the first step, a first material is provided that adheres to the contact pads selectively. As a result of which the surface of the contact pad is modified to a desired surface property. In the second step, then the protective layer is provided, which will not adhere to the material at the contact pad. The layer of first material may be removed afterwards. However, if this layer is sufficiently thin and does not constitute a barrier for solder, this is not necessary. A suitable realisation hereof, particularly in combination with an adhesion layer of for instance gold, is a thiol with modified end groups. Such a thiol will form a monolayer on the gold surface. The exposed rear side of the monolayer can be given any desired surfacial properties.

In a second embodiment, use is made of a material that becomes fluid to a certain extent on heating. The pressure of the solder balls during the reflow processing for attachment to an external board is then sufficient to remove the protective layer locally. Examples of such materials include acrylates and fatty acids, such as stearine acid.

The fatty acids are known from use in materials referred to as solder flux materials. Preferably, use is made of an organic solvent on application of these solder fluxes, such as alcohols. This tends to give a protection against any cleaning liquid conventionally used before placement of the device on an external board.

The acrylates will melt on gentle heating, for instance to 100° C., and are subsequently cured. The use of these type of materials in assembly processes is described in the non-prepublished application WO IB03/02292 (PHNL020471), that is herein included by reference. The heating will make the device moves downwards, therewith establishing a connection between any solder ball and the contact pads. The subsequent raise of the temperature to higher temperatures, for instance during reflow processing or separately, will then cross-link the acrylate to make it a layer that is stable in temperature.

In a third embodiment, use is made of the cavity-like structure of the second side of the carrier. Then use is made of a material which is hardened or cured when present in the cavity, but not when present as a thin film at the contact pads. A particular example hereof is a material that can be cured anaerobically. This is for instance an acrylate ester in a specifically chosen solvent, such as a acrylate ester in a hydroperoxide. A suitable example is a dimethylacrylate ester in cumenehydroperoxide. Alternatively, a filling material is provided so as to fill the cavity-like structures, and subsequently a cleaning or polishing step is done to bring the contact pads at the surface again.

In a fourth and preferred embodiment, the carrier is provided with a masking layer at its second side, through which masking layer first the carrier layer is patterned into contact pads, as a result of which patterning process the masking layer has a larger surface area than the corresponding contact pads, whereafter a positive photosensitive composition is applied at the second side of the carrier, that is subsequently patterned into irradiated and non-irradiated areas in a photolithographical treatment in which the masking layer is used as a mask, the irradiated areas being washed away. In this embodiment use is made of the carrier as described in the non-prepublished application WO IB 03/01299 (PHNL021100). Since the etching of the carrier layer leads thereto that the masking layer laterally extends to the carrier layer, the masking layer can be used in a subsequent step again. Positive photosensitive compositions are known per se, as positive photoresists. Alternatively, they may be prepared by addition of a suitable photochemical initiator to a suitable composition. Such a composition may include any desired material, which can be designed to have a good adhesion to both the material of the contact pad and that of the intermediate layer. The material may even be an electrically conductive polymer.

The electric element is preferably encapsulated in the electrically insulating material. However, this is not necessary per se. The element may be provided in any cavities at the first side of the carrier. The element may also be mounted at the second side of the carrier at the end of the process. In this case, the connection layer functions as an interconnection layer parallel to the first side of the carrier. If encapsulated, the encapsulation may be present at the side faces of the element only. The face facing away from the carrier is then available for the provision of any heat dissipating layer. This is particularly suitable if the element is an integrated circuit or power device.

In a further method, use is made of a material that is applicable by dipping or immersing into a solution, particularly an aqueous solution. Suitable materials are those that are bound to the intermediate layer 12 and/or the second metal layer 13 chemically. Examples hereof are inorganic materials such as $CrO_2$, $TiO_2$, $ZrO_2$, $CeO_2$. In addition, an organic coating with a coefficient of thermal expansion similar to copper may be applied. Suitable coatings would for instance be silicones, epoxgies and amides.

The electric element may very well be a semiconductor device, in that the resolution of the carrier is sufficient for both coupling with wirebonds and with flip chip. In the case that mounting of the electric element in a flip-chip orientation is foreseen, the thickness of the carrier layer is enlarged in comparison to the intermediate layer and the connection layer. This allows an increase in the resolution of the patterns defined in the connection layer and thus also in the intermediate layer, without loss of mechanical stability.

It is a second object of the invention to provide an electronic device of the kind mentioned in the opening paragraph, that allows rerouting and/or interconnecting in the carrier and has a good adhesion of the carrier to the encapsulation without the risk of delamination during any soldering steps exerted on the device.

This object is achieved in that a protective layer is present at the second side of the carrier so as to protect an interface between the intermediate layer and the contact pads. As indicated with reference to the method of the invention, the protective layer solves the problem of delamination, and allows the use of a carrier wherein the interconnection layer is mechanically anchored in the encapsulation.

It is preferred that the connection layer and the contact pads are embodied in copper, and a different material is used for the intermediate layer. Copper is a material with good conductivity that is well known for use. Moreover, it can be used with a large variety of bumps of different compositions, if necessary after provision of an adhesion layer or bilayer. Suitable materials for the intermediate layer include Fe—Ni, Fe—Cr—Ni, Al, alloys of Al, Ni, Cr, such as $Al_xSi_{1-x}$, $Al_xCu_{1-x}$ and $Al_xGe_{1-x}$, with preferably $0.5 \leq x \leq 0.99$, and others.

In a preferred embodiment, at least a number of contact pads is laterally displaced with respect to the corresponding patterns in the connection layer. The invention is particularly suitable for this embodiment, in that the interface between the contact pads and the intermediate layer is herein is fully exposed at the second side of the carrier. In the device known in the prior art, this is not the case, as the NiAu will cover the intermediate layer fully. Also, the intermediate layer therein comprises Cu. The adhesion of Cu to Ni is however not as problematic as for instance the adhesion of Cu to Al.

It is advantageous herein, that the contact pads have a sufficient thickness. Therewith, the layer of the contact pads can be used as carrier layer in accordance with the method of the invention. Moreover, the contact pads will have a surface that extends beyond the surface of the intermediate layer. The intermediate layer can thus be covered by the protective layer, which thereto extends laterally.

In a further modification, the protective layer fills any cavity-like structure between the contact pads. As a result hereof, the device has at the second side of the carrier a surface that is substantially planar. Proper observation of the second side of the carrier will show that the contact pads arise as protrusions on a surface of the intermediate layer. With the cavity-like structure is then referred to the space between the contact pads, which has in a cross-sectional view through the contact pads the shape of a cavity.

In a preferred embodiment, the contact pads comprise a main layer and a masking layer, said masking layer being present at the second side of the carrier and having a larger surface area than the main layer. The protective layer is then substantially present between the masking layer and the intermediate layer, such that on perpendicular projection of the protective layer on the masking layer there is a substantial overlap. This structure is the result of the fourth embodiment of the method of the invention. It is a suitable implementation that does not need any photolithographical masks in the assembly. An exposure to a light source suffices. Furthermore, the embodiment has the advantage that the space between the contact pads is not filled completely. This allows to cope with differences in thermal coefficients of expansion between the various layers more easily.

The element is preferably a semiconductor device that is at least partially encapsulated in the encapsulation.

These and other aspects of the invention will be further elucidated with reference to the figures, in which.

Figure 1:
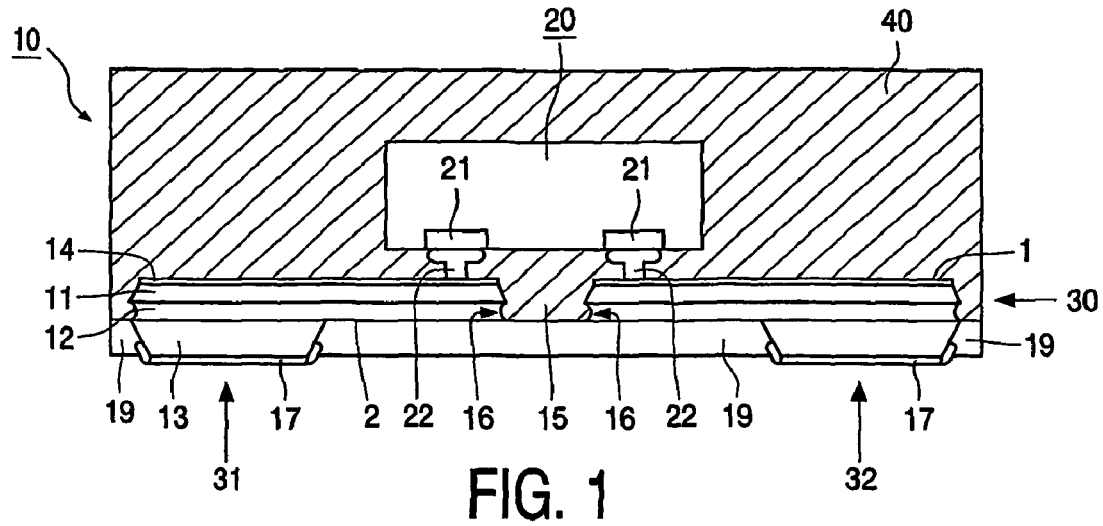
FIG. 1 is a diagrammatic cross-sectional view of a first embodiment of the electronic device.

The figures are not drawn to scale. Like reference numerals refer to like parts. Alternative embodiments are possible within the scope of protection of the appended claims.

Figure 2:
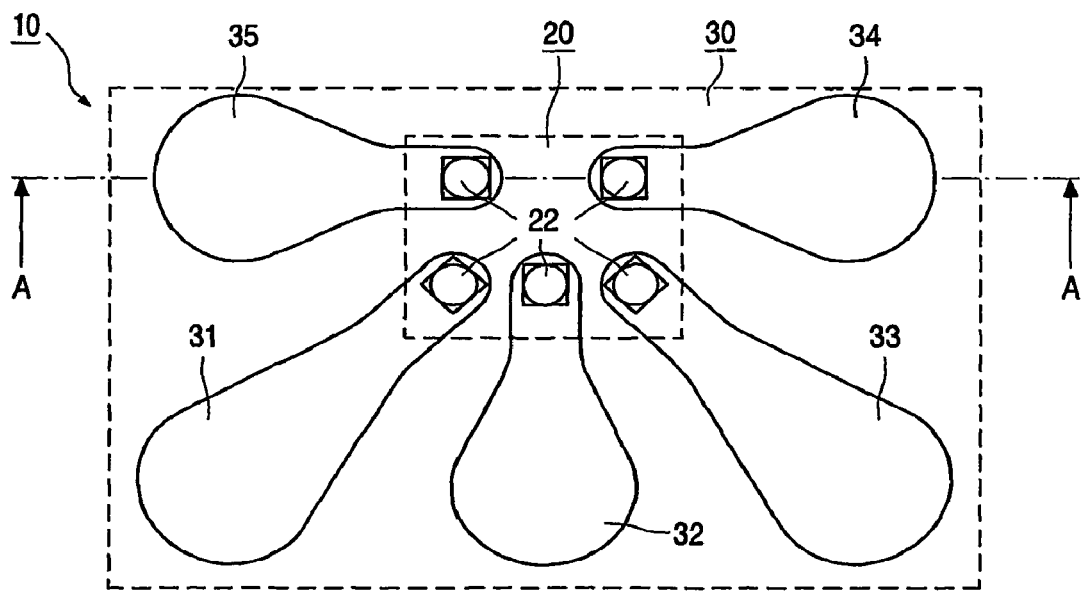
FIG. 2 is a diagrammatic plan view of the first embodiment.

FIG. 1 is a diagrammatic cross-sectional view of a first embodiment of an electronic device 10. In this case, said electronic device is a semi-discrete semiconductor device with five contacts. This however is by no means essential. FIG. 2 is a diagrammatic plan view of the first embodiment, wherein the line A-A indicates the cross-section of FIG. 1. The semiconductor device comprises a carrier 30 with a first metal layer 11, an intermediate layer 12 and a second metal layer 13. In this example, the first and the second metal layer 11, 13 comprise Cu, and the intermediate layer comprises $Al_{0.99}Si_{0.01}$. Furthermore, the carrier 30 comprises a first etch mask 14 and a second etch mask 17. The first and the second etch mask 14, 17 each comprise an adhesive layer of NiAu. The carrier 30 is patterned from the first side by means of the first etch mask 14, thereby forming apertures 15 and connection conductors 31-35. For this purpose use is made of an etching process wherein first the first metal layer 11 is etched and subsequently the intermediate layer 12 is etched, thereby forming recesses 16 in the side faces of the connection conductors 31-35. Subsequently, the semiconductor element 20 having connection regions 21 is connected to the connection conductors 31-35 by connection means 22, in this case bumps of Au. For this purpose, use is made of a flip-chip technique. Subsequently the envelope 40 is provided, resulting in the formation of a mechanical anchor since the envelope 40 extends into the recesses 16 of the carrier. Mechanical anchoring can be achieved by any manner, in which one of the layers covered by the envelope 40 extends laterally, and this at least partially. These layers include the first etch mask 14, the first metal layer 11 and the intermediate layer 12. Particularly if the first metal layer 11 has sufficient thickness, in the order of 10 μm or more, preferably at least 20 μm, the etching of this first metal layer 11 will give rise to a profile. Thus, the first etch mask 14 will extend laterally beyond the first metal layer 11, and this is sufficient for the anchoring. The intermediate layer 12 can be chosen, in connection herewith, to have any desired thickness and to be of any desired material. Subsequently, the second metal layer 13 is patterned by means of the second etch mask 17. This is achieved by placing the device in an etch bath that selectively removes the second metal layer 13 with respect to the intermediate layer as well as with respect to the second etch mask 17. Etching materials are known per se, and can also be found in the application WO IB 03/01299. The apertures 15 are subsequently also used to separate the semiconductor devices 10. This has the additional advantage that the mechanical anchoring substantially encapsulates the connection conductors 31-35, i.e. not only at the location of the semiconductor element 20 but also beyond said element. The size of the semiconductor device 10 is, for example, approximately 1 by 1 mm. The opening 15 has a width of, for example, 40-100 μm. The thicknesses of the first metal layer 11, the intermediate layer 12 and the second metal layer 13 were chosen to be, respectively, 30 μm, 40 μm and 30 μm. However, this may be chosen in accordance with the requirements of the application. The first metal layer 11 and the intermediate layer 12 could each have a thickness of about 20 μm, whereas the third metal layer has a thickness of 60 μm. According to the invention, subsequently a protective layer 19 is applied. This is done, in this embodiment by providing a composition of dimethylacrylate ester in cumenehydroperoxide. This composition will harden out in the space between the contact pads 31,32, but not at the surface. As a consequence, the surface layers 17 are kept free of the protective layer 19. Although the figure shows that the protective layer results in a substantially planar surface, this is not necessary.

Figure 3:
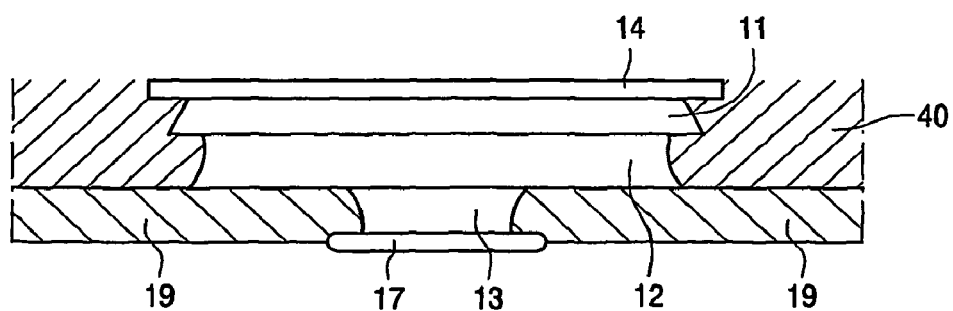
FIG. 3 is an enlargement of the cross-sectional view shown in FIG. 1

FIG. 3 shows a detail of FIG. 1, in which more precisely the form of the layers is described as obtained in an embodiment of the invention. The intermediate layer 12 is shown to have at the interface with the first metal layer 11 a smaller diameter than at the opposite side, resulting in the mechanical anchoring into the intermediate layer. Furthermore, it is clear that the etch mask 17 extends laterally beyond the third metal layer 13. Preferably, the etch mask is deformed in a controlled manner. This is for instance implemented by providing a block, for instance of rubber at the surface of the etch mask 17. By pressing the somewhat deformable block on the etch mask 17, it will push the edges of the etch mask 17 towards the intermediate layer 12. This prevents damage to these etch masks afterwards.

The invention claimed is:

1. A method of manufacturing an electronic device provided with an electric element and a carrier with a first side and an opposed second side, comprising:

providing the carrier comprising a patterned connection layer, an intermediate layer and a continuous carrier layer of electrically conductive material, the connection layer is present at the first side of the carrier, said intermediate layer comprising an electrically conductive material and having a pattern substantially corresponding to that of the connection layer;

mounting the electric element to the carrier;

applying an electrically insulating material which extends to a surface of the intermediate layer;

patterning the carrier layer from the second side of the carrier, therewith creating contact pads for external contacting, the contact pads are connected to corresponding patterns in the connection layer through interconnects in the intermediate layer, and providing a protective layer at the second side of the carrier, the protective layer in contact with and covering an interface between the intermediate layer and the contact pads.

2. The method as recited in claim 1, wherein the protective layer comprises an electrically insulating material and leaves the contact pads exposed.

3. The method as recited in claim 1, wherein the carrier is provided with a masking layer at its second side, the carrier layer is first patterned through the masking layer and into contact pads, and as a result of the patterning process the masking layer has a larger surface area than the corresponding contact pads, whereafter a positive photosensitive composition is applied at the second side of the carrier, that is subsequently patterned into irradiated and non-irradiated areas in a photolithographical treatment in which the masking layer is used as a mask, the irradiated areas being washed away.

4. The method as recited in claim 1, wherein:

the connection layer of the carrier comprises bond pads, and the electric element is mounted at the first side of the carrier, bond pads of the element being coupled to corresponding bond pads in the connection layer.

5. The method of claim 1, wherein the protective layer provides mechanical support that suppresses delamination of the intermediate layer and the contact pads.

6. The method of claim 1, wherein the protective layer is provided by one of spraying, dipping, coating and vapor deposition.

7. The method of claim 1, wherein the electronic device includes an assembly of a plurality of individual devices designed for separation into individual devices and wherein the protective layer is provided before separation of the assembly into a plurality of individual devices.

8. The method of claim 1, wherein the step of providing the protective layer includes the steps of adhering a first material to the contact pads and adhering a second material that does not adhere to the first material to the second side of the carrier, wherein the second material forms the protective layer.

9. The method of claim 1, wherein the step of providing the protective layer includes the steps of applying a material that covers both the contact pads and the interface between the intermediate layer and the contact pads and removing the material through the application of pressure of solder balls during a reflow processing, thereby leaving the contact pads exposed and the interface between the intermediate layer and the contact pads covered.

10. The method of claim 1, wherein the step of providing a protective layer includes providing a layer the chemically bonds with the intermediate layer and the contact pads.

* * * * *